United States Patent
Ghosh et al.

(10) Patent No.: US 12,044,704 B2
(45) Date of Patent: Jul. 23, 2024

(54) METHOD OF CENTERING PROBE HEAD IN MOUNTING FRAME

(71) Applicant: FormFactor, Inc., Livermore, CA (US)

(72) Inventors: Kalyanjit Ghosh, Pleasanton, CA (US); Douglas Stewart Ondricek, Livermore, CA (US); Paul Hsiao, Sunnyvale, CA (US)

(73) Assignee: FormFactor, Inc., Livermore, CA (US)

( * ) Notice: Subject to any disclaimer, the term of this patent is extended or adjusted under 35 U.S.C. 154(b) by 3 days.

(21) Appl. No.: 17/682,825

(22) Filed: Feb. 28, 2022

(65) Prior Publication Data

US 2022/0276281 A1    Sep. 1, 2022

Related U.S. Application Data

(60) Provisional application No. 63/155,099, filed on Mar. 1, 2021.

(51) Int. Cl.
*G01R 1/073*  (2006.01)
*G01R 31/28*  (2006.01)

(52) U.S. Cl.
CPC ..... *G01R 1/07342* (2013.01); *G01R 31/2886* (2013.01)

(58) Field of Classification Search
CPC ............ G01R 1/07342; G01R 31/2886; G01R 1/07314; G01R 1/07378
See application file for complete search history.

(56) References Cited

U.S. PATENT DOCUMENTS

| | | | |
|---|---|---|---|
| 6,373,271 B1* | 4/2002 | Miller | G01R 31/2887 324/756.07 |
| 2002/0024355 A1* | 2/2002 | Suzuki | G01R 1/07314 324/754.15 |
| 2019/0033343 A1* | 1/2019 | Genkin | G01R 31/26 |

* cited by examiner

*Primary Examiner* — Christopher P McAndrew
(74) *Attorney, Agent, or Firm* — LUMEN PATENT FIRM

(57) ABSTRACT

A modular probe array for making temporary electrical contact to devices under test is provided. The probe array includes multiple probe heads each having a substrate disposed within a mounting block. Improved thermal cycling performance is obtained by using an O-ring between the substrate and the mounting block. Optionally, set screws can be used in combination with the O-ring to set the position of the substrate in its mounting block.

4 Claims, 4 Drawing Sheets

METHOD OF CENTERING PROBE HEAD IN MOUNTING FRAME

CROSS REFERENCE TO RELATED APPLICATIONS

This application claims priority from U.S. Provisional Patent Application 63/155,099 filed Mar. 1, 2021, which is incorporated herein by reference.

FIELD OF THE INVENTION

This invention relates to electrical probe arrays for making temporary electrical contact to devices under test.

BACKGROUND

Electrical devices and circuits are often tested using probes configured to make temporary electrical contact to a device under test. Since devices under test can have a wide variety of configurations, there are correspondingly varied configurations for the probes.

An exemplary probe configuration is shown on FIG. 1. This example has multiple probe heads 104 disposed on the probe card 102. An individual probe head assembly is shown in FIG. 2 (top and side views). The springhead 208, the mounting block 106 (holding the springhead) and the substrate 108 (e.g., a multi-layered ceramic (MLC)) together form the probe head 104. See the bottom part of FIG. 2 (side view), where the springhead 208 includes vertical probes 110, upper guide plate 204, and lower guide plate 206. In practice, the probe head usually further includes a spacer (not shown) to mechanically hold the guide plates in proper alignment to the substrate. The springhead carries the probes 110 which are eventually in contact with the device under test. On the tester side of the substrate opposite the probe side of the substrate, interposer springs of the test equipment are in contact with the contact pads 210 (e.g., a land grid array (LGA)) of the substrate.

By making the overall probe array modular in this manner, three main advantages are provided. The first is that bad probes can be replaced by substituting the individually affected probe heads, which can be much less expensive than replacing an entire probe array. The second is that fine-tuning the position of each spring head in its corresponding mounting block can provide finer adjustment of the probe location. For example, this can be achieved by having datums 112 on the probe card touching vertical sides of the probe head (FIG. 1). A third advantage of this design is that a much larger probe density can be achieved than regular probe card designs.

Once the location of the substrate 108 within the probe head 104 is fixed, it is then required to stay in place during thermal cycling. In one known approach, substrate 108 is positioned in mounting block 106 using setscrews 202, as shown on FIG. 2. For example, there can be two setscrews on one face of the mounting block 106 that push the substrate 108 up against the opposite surface, and another two set screws for the orthogonal direction, as shown. The setscrews have nylon tipped heads which get deformed over multiple thermal cycles and we see some hysteresis of the movement of the ceramic with temperature. Non-uniform thermal contact between the substrate 108 and the mounting block 106 also leads to undesirable temperature variation in the springhead position.

Accordingly, it would be an advance in the art to provide a modular probe array with improved temperature cycling performance.

SUMMARY

In this work, these issues are alleviated by using an O-ring 302 to center the substrate 108 in the mounting block 106 (FIG. 3) of probe head 304. The O-ring provides equal and opposite compression on all four sides of the substrate at all temperatures. It therefore always maintains the centering of the substrate during the thermal cycling without the application of any external force. In contrast, the existing process of using setscrews shows undesirable movement hysteresis as noted earlier.

The O-rings also help to thermally isolate the substrate from the mounting-block (as it is no longer in direct contact on the vertical surface). It lowers the temperature of the interposer springs, compared to if the substrate were in full contact with the vertical face of the mounting-block 106. It can thus extend the life of the interposer springs.

In the embodiment of FIG. 4, the O-ring 302 is used in combination with set screws 202 for positioning substrate 108 within mounting block 106.

DETAILED DESCRIPTION

Figure 1:
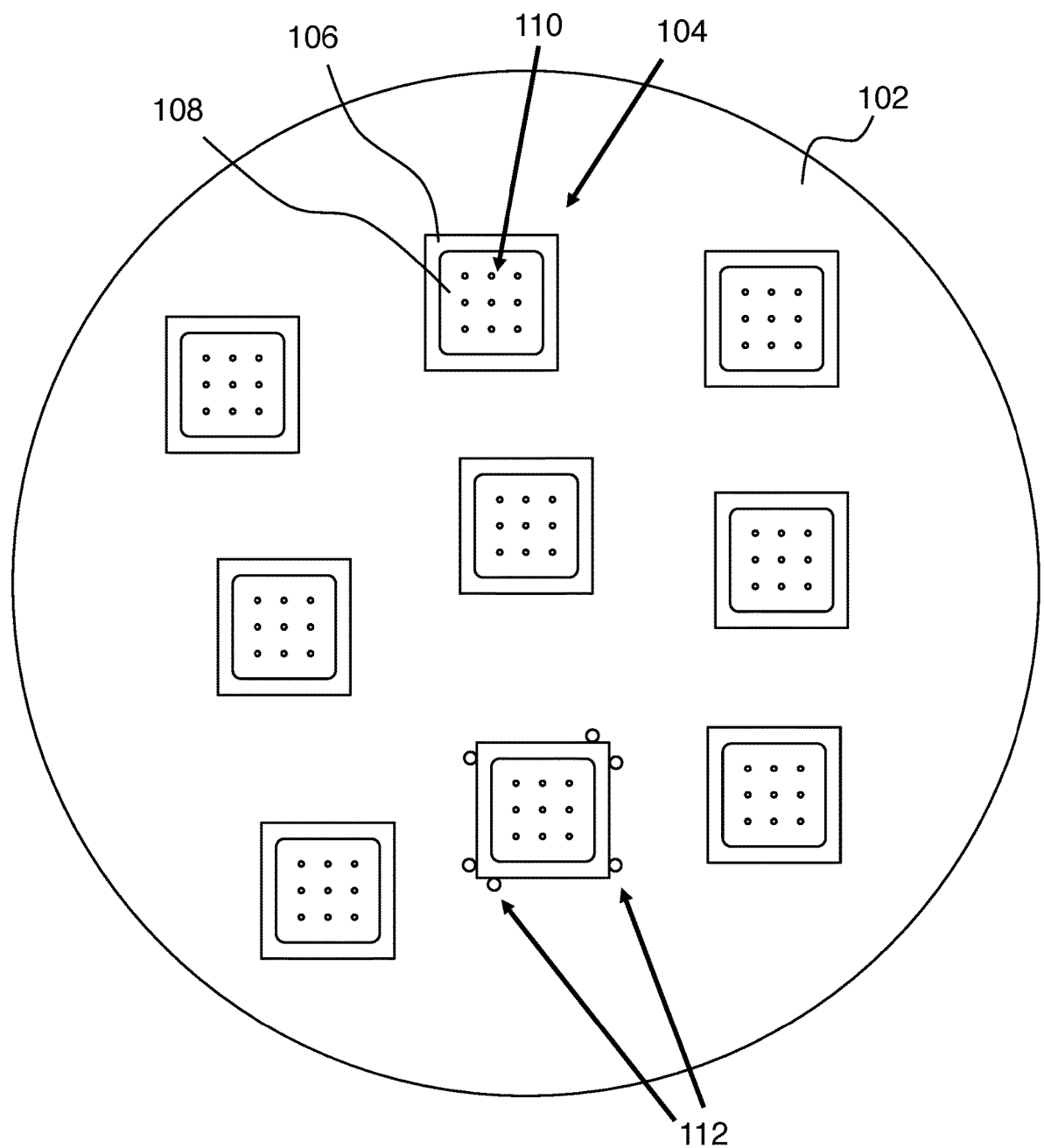
FIG. 1 shows a modular probe card including multiple probe heads.

FIG. 1 shows a modular probe card including multiple probe heads for making temporary electrical contact to a device under test. Here 102 is a probe card and multiple probe heads 104 are disposed on probe card 102 and laterally separated from each other, as shown. Each probe head 104 includes a mounting block 106 affixed to probe card 102, a substrate 108 configured to be disposed in an opening of mounting block 106, and a spring-head affixed to substrate 108 (sees FIGS. 2, 3, 4 for spring-head 208). Each spring-head includes two or more vertical probes 110 for making temporary electrical contact to the device under test. Each mounting block 106 laterally surrounds its corresponding substrate 108. The view of FIG. 1 is from the device under test looking at the probe array (i.e., a bottom view if the probe array is regarded as making contact to the device under test from the top). Optionally, probe card 102 can include features such as datums 112 for precisely positioning one or more of the probe heads 104 on probe card 102. Although the view of FIG. 1 is useful for showing the entire probe array, the differences between the prior art and embodiments of the invention cannot readily be seen in this view, and so the later figures show views of individual probe heads where these differences are more apparent. In all cases, it is understood that the full probe array is as on FIG. 1 (i.e., that it includes multiple probe heads).

Figure 2:
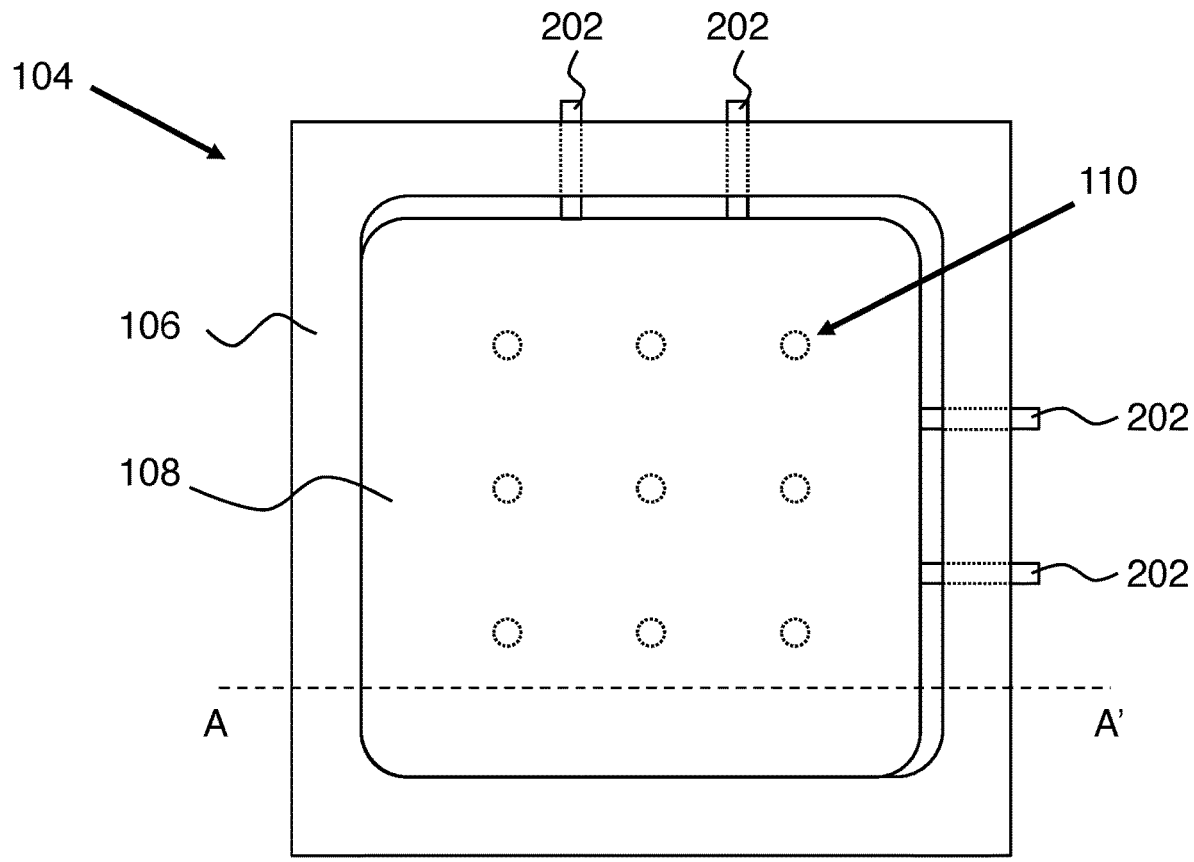
FIG. 2 shows a prior art probe head configuration.
Figure 2:
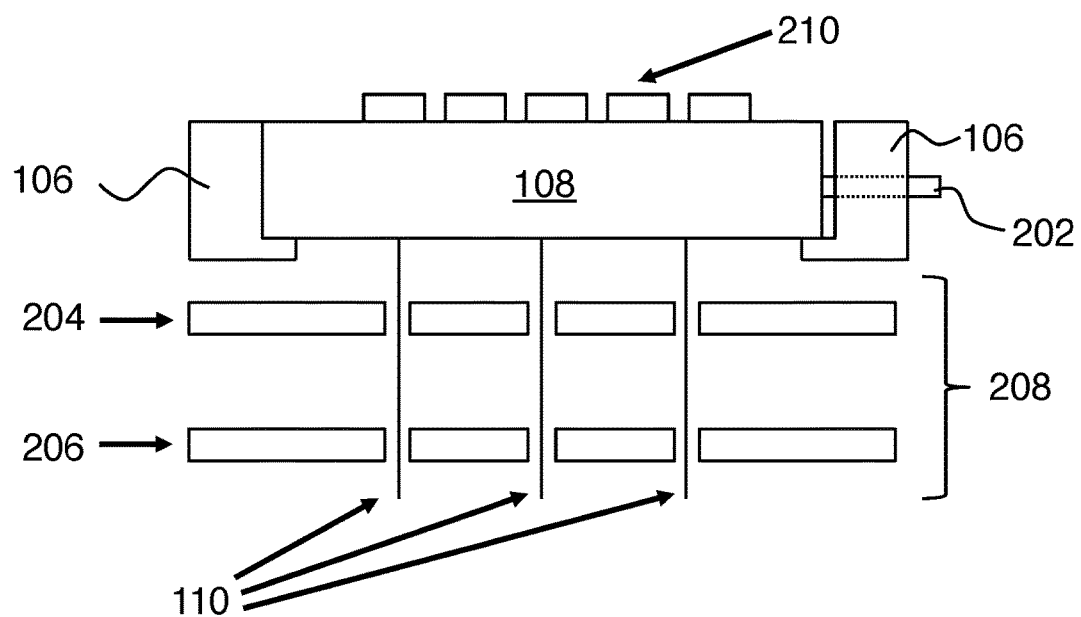

FIG. 2 shows a prior art probe head configuration. The top part of this figure is a view looking down from the top (so the probes on the bottom of the probe head are represented as dotted circles) and the bottom part of this figure is a side view along line AA'. Here optional upper and lower guide plates 204 and 206, respectively, are shown included in spring-head 208. Also shown are set screws 202 configured to set the position of substrate 108 in mounting block 106 as shown. Substrate 108 can be a multi-level ceramic structure including a network of conductors (not shown) suitable for connecting its probes 110 to the test equipment via contacts made to contact pads 210. Such multi-level ceramic substrates for probe arrays are known in the art, so they are not further described here.

Figure 3:
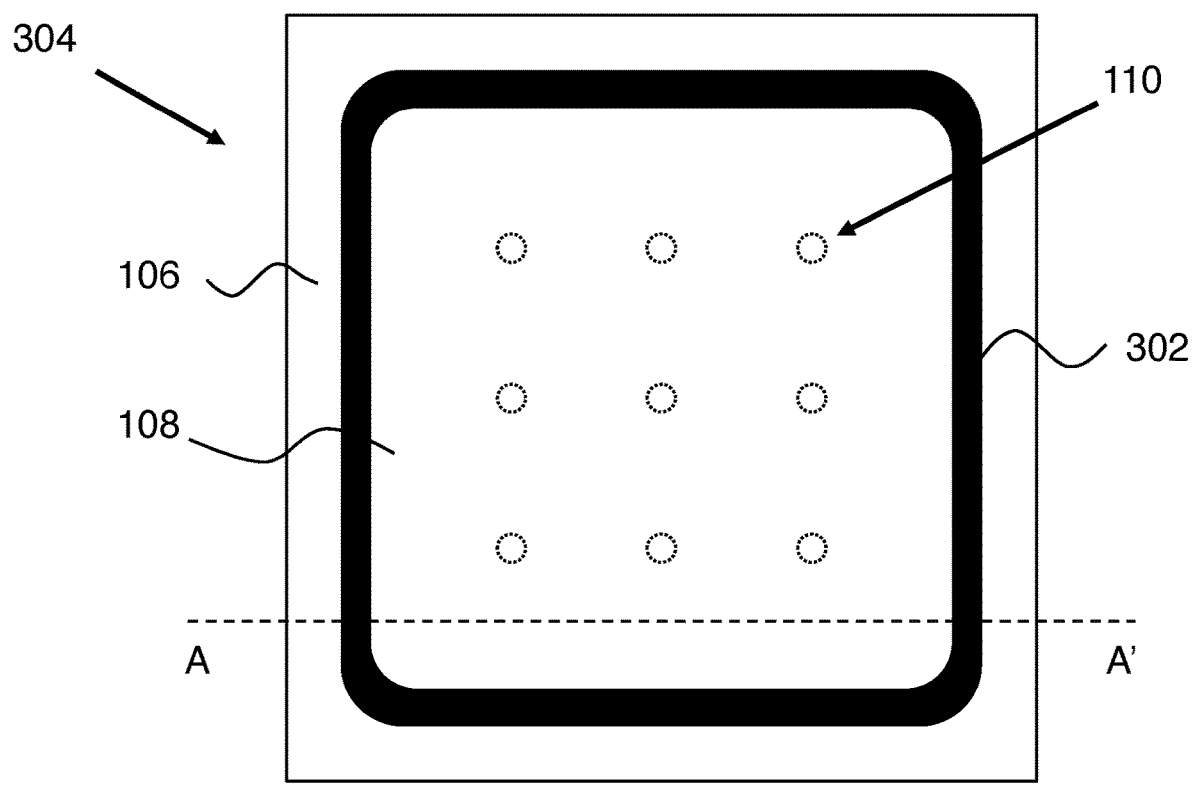
FIG. 3 shows a probe head according to a first embodiment of the invention.
Figure 3:
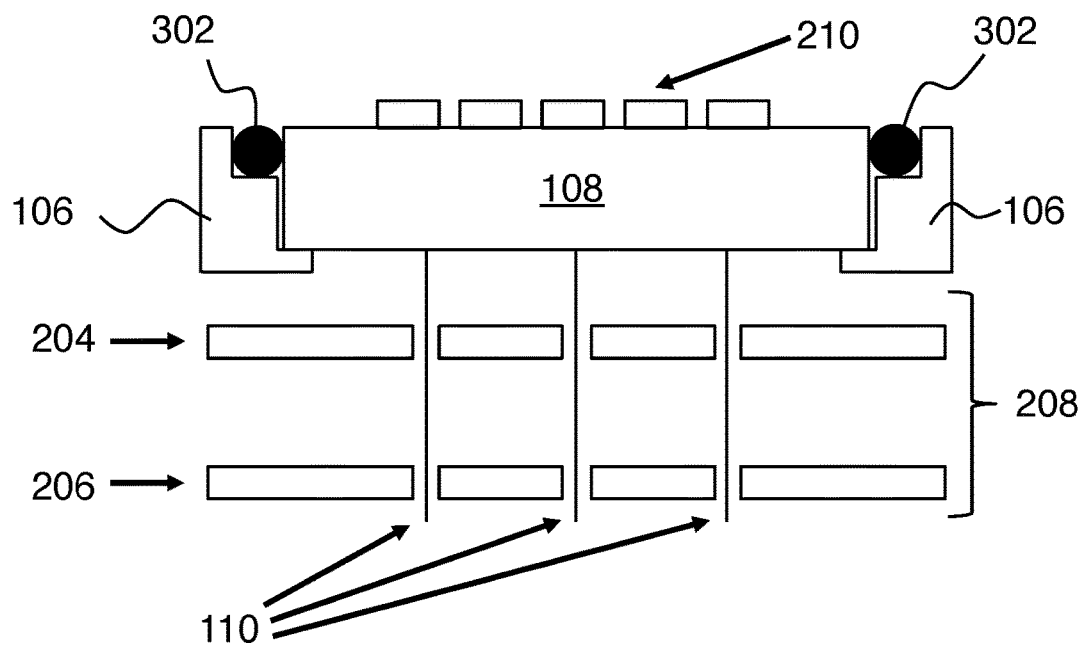

FIG. 3 shows a probe head according to a first embodiment of the invention. This embodiment is like the example of FIG. 2, except that set screws 202 are not present, and instead an O-ring 302 is disposed in a lateral gap between substrate 108 and mounting block 106, as shown. As indicated above, this O-ring configuration suffices to determine the position of substrate 108 relative to mounting block 106 without the disadvantages of the set screw configuration of FIG. 2. Here also, optional upper and lower guide plates 204 and 206, respectively, are shown included in spring-head 208, and/or substrate 108 can be a multi-level ceramic structure including a network of conductors (not shown) suitable for connecting its probes 110 to the test equipment via contacts made to contact pads 210.

Figure 4:
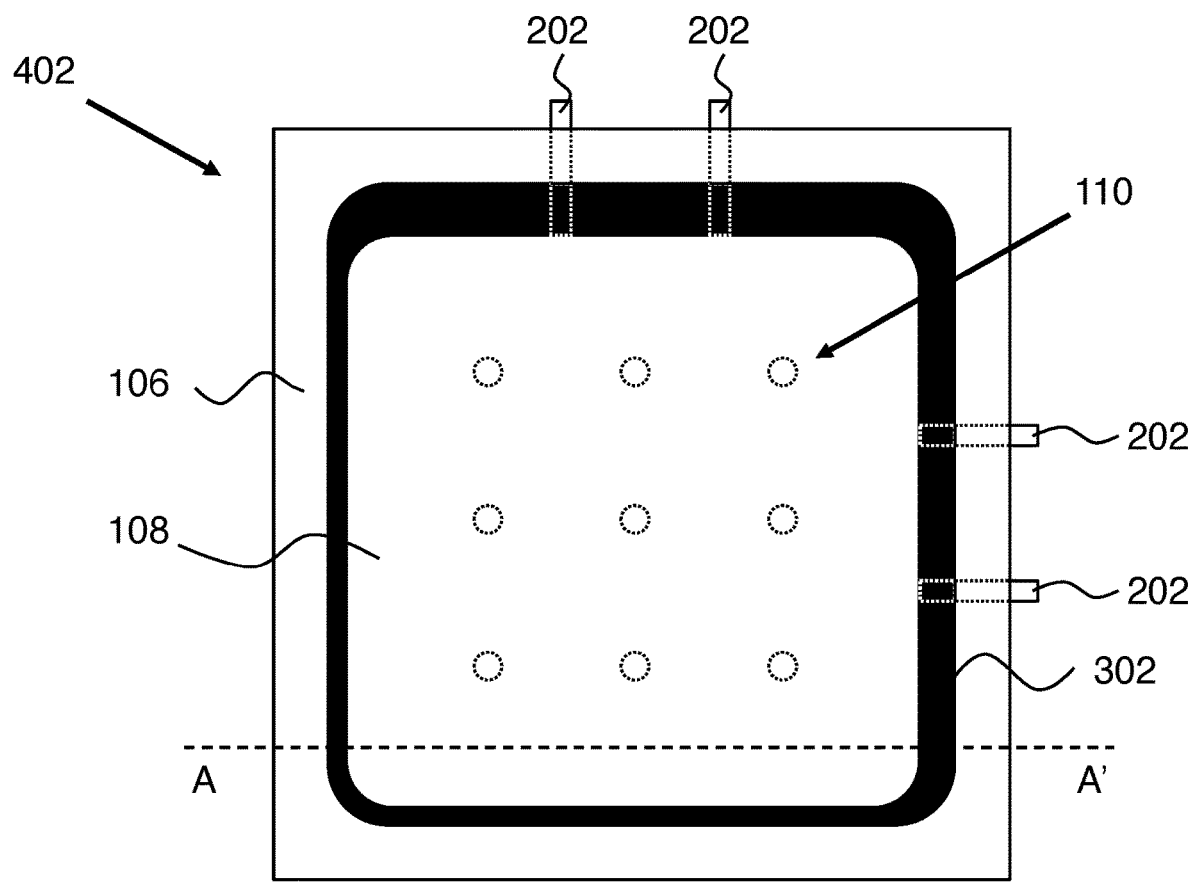
FIG. 4 shows a probe head according to a second embodiment of the invention.
Figure 4:
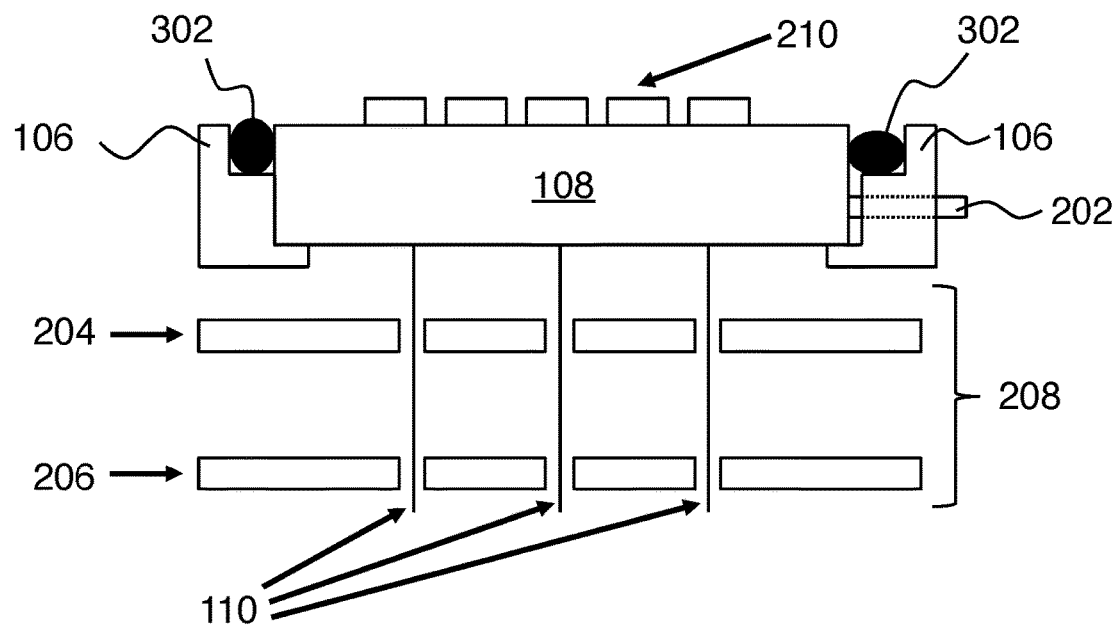

FIG. 4 shows a probe head according to a second embodiment of the invention. This embodiment is like the example of FIG. 3, except that set screws as on FIG. 2 are also employed, as shown. The two or more set screws 202 are configured to adjust a lateral position of substrate 108 in the opening of the corresponding mounting block 106 in at least one of the two or more probe heads.

In thermal cycling testing done to date, we have found the embodiment of FIG. 4 to be preferable to the embodiment of FIG. 3 and to the prior art configuration of FIG. 2. More specifically, the maximum lateral probe motion after thermal cycling was about 2× higher in the configurations of FIGS. 2 and 3 than it was for the configuration of FIG. 4. Since such motion is undesirable, it means the configuration of FIG. 4 performed better. Details of the thermal cycling were as follows—5 hours at −40 C and then the temp goes up to 125 C where it stays for another 5 hours and then back down to −40 C to complete one cycle. Three cycles were run.

Without being bound by theory, it is believed that the better performance of the configuration of FIG. 4 compared to the configuration of FIG. 3 is that a tendency of the O-ring 302 to pop out of its groove during thermal cycling is alleviated by having set screws 202 constrain the motion of substrate 108 within mounting block 106. Meanwhile, having O-ring 302 in place retains the above-described advantages relative to the configuration of FIG. 2 (i.e., only set screws).

The invention claimed is:

1. A modular probe array for making temporary electrical contact to a device under test, comprising:
    two or more probe heads disposed on a probe card and laterally separated from each other, wherein each probe head includes a mounting block affixed to the probe card, a substrate configured to be disposed in an opening of the mounting block, and a spring-head affixed to the substrate;
    wherein each mounting block laterally surrounds its corresponding substrate;
    wherein each spring-head includes two or more vertical probes for making temporary electrical contact to the device under test;
    wherein each probe head further comprises an O-ring disposed in a lateral gap between the substrate and the mounting block; wherein the O-ring is configured to improve a mechanical centering of the substrate within the mounting block.

2. The modular probe array of claim 1, further comprising two or more set screws configured to adjust a lateral position of the substrate in the opening of the corresponding mounting block in at least one of the two or more probe heads.

3. The modular probe array of claim 1, wherein at least one of the spring-heads includes an upper guide plate and a lower guide plate to guide motion of its vertical probes.

4. The modular probe array of claim 1, wherein the substrate is a multi-level ceramic structure.

* * * * *